United States Patent [19]

Chou et al.

[11] Patent Number: 5,722,162
[45] Date of Patent: Mar. 3, 1998

[54] FABRICATION PROCEDURE FOR A STABLE POST

[75] Inventors: William T. Chou, Cupertino; Solomon I. Beilin, San Carlos; David A. Horine, Los Altos; David Kudzuma; Michael G. Lee, both of San Jose; Larry Louis Moresco, San Carlos; Wen-chou Vincent Wang, Cupertino, all of Calif.

[73] Assignee: Fujitsu Limited, Kanagawa, Japan

[21] Appl. No.: 541,219

[22] Filed: Oct. 12, 1995

[51] Int. Cl.⁶ .................................................. H05K 3/10
[52] U.S. Cl. ............................ 29/852; 29/846; 29/874; 216/18; 430/313
[58] Field of Search ............................ 29/846, 852, 874, 29/884; 430/311, 312, 313, 314, 315, 325; 174/262, 267; 216/17, 18; 427/97

[56] References Cited

U.S. PATENT DOCUMENTS

| | | | |
|---|---|---|---|
| 4,371,423 | 2/1983 | Yoshizawa et al. | 156/653 |
| 4,519,872 | 5/1985 | Anderson, Jr. et al. | 430/314 X |
| 4,567,132 | 1/1986 | Fredericks et al. | 430/312 |
| 4,621,045 | 11/1986 | Goodner | 430/311 |
| 4,703,559 | 11/1987 | Ehrfeld et al. | 29/854 |
| 4,770,897 | 9/1988 | Wu | 437/228 |
| 4,961,259 | 10/1990 | Schreiber | 29/852 |
| 5,126,232 | 6/1992 | Gau | 430/320 |
| 5,127,989 | 7/1992 | Haraguchi et al. | 156/643 |
| 5,147,740 | 9/1992 | Robinson | 430/5 |
| 5,206,117 | 4/1993 | Labordie et al. | 430/325 |
| 5,209,688 | 5/1993 | Nishigaki et al. | 445/24 |
| 5,229,257 | 7/1993 | Cronin et al. | 430/315 |
| 5,229,258 | 7/1993 | Sezi et al. | 430/325 |
| 5,334,804 | 8/1994 | Love et al. | 174/267 |

FOREIGN PATENT DOCUMENTS

61-20334A  1/1986  Japan ............................. H01L 21/302

OTHER PUBLICATIONS

Colclaser, *Microelectronics: Processing and Device Design*, New York: John Wiley & Sons, 1980, pp. 22–49.

*Primary Examiner*—Peter Vo
*Assistant Examiner*—Khan V. Nguyen
*Attorney, Agent, or Firm*—Coudert Brothers

[57] ABSTRACT

An interconnecting post for mounting a microelectronic device such as an integral circuit chip is fabricated with generally uniform cross-section, by forming a first layer of positive photoresist on a substrate, soft-baking that first layer and exposing it for a short time with a wide-apertured mask or simply a UV blank flood exposure. Without developing the first layer, a second layer of positive resist is then applied over the first layer, soft-baked, and then exposed with a narrow-apertured mask. During the soft-baking of the second layer, some of its activator in the photoresist compound diffuses into the exposed portion of the first layer and modifies its solubility in such a way that, when the layers are subsequently developed, the developer partially undercuts the unexposed portion of the first layer to form in the photoresist an opening of generally uniform cross-section. This opening can then be filled by plating to produce a strong, integral interconnect post.

16 Claims, 4 Drawing Sheets

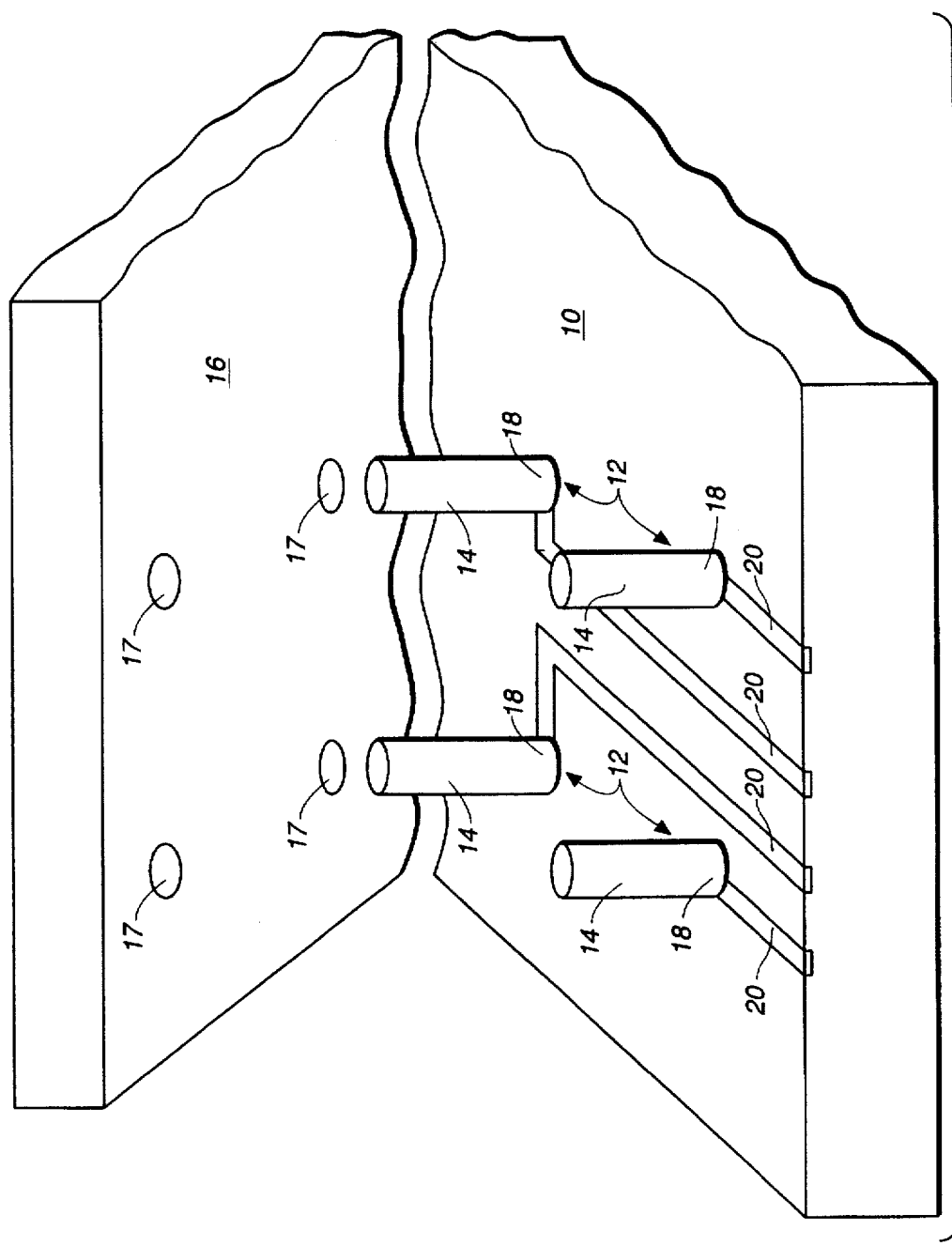

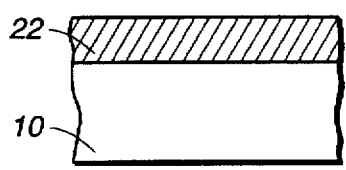
FIG._2
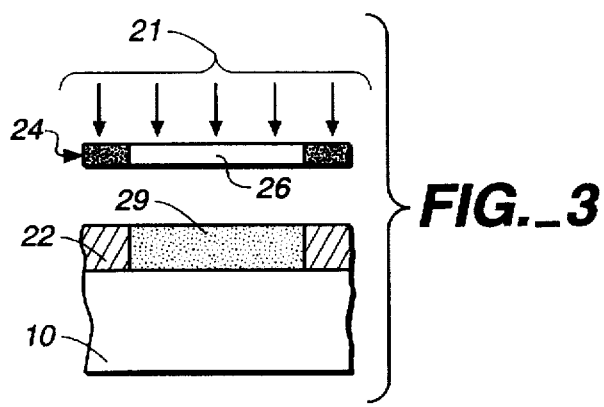
FIG._3
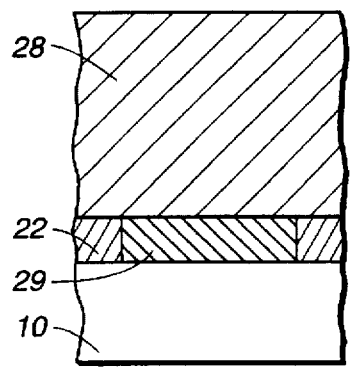
FIG._4
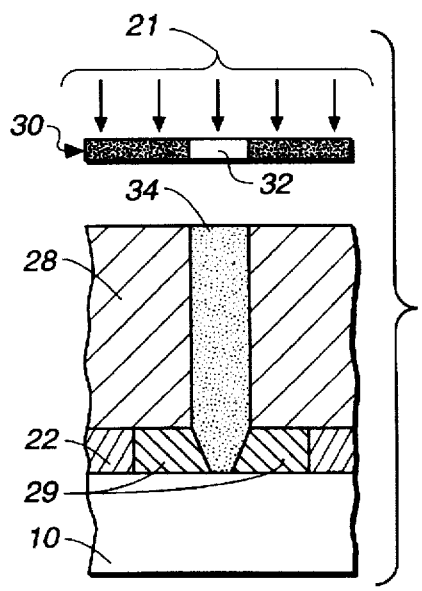
FIG._5
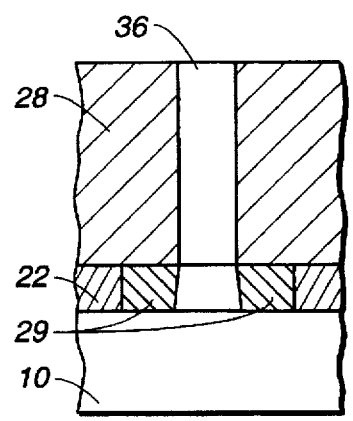
FIG._6
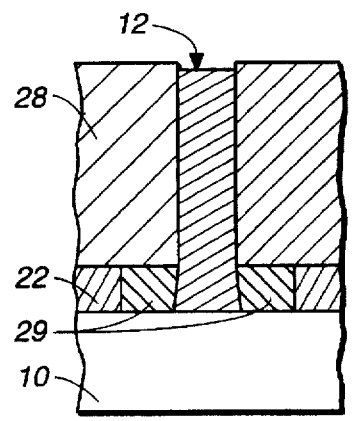
FIG._7
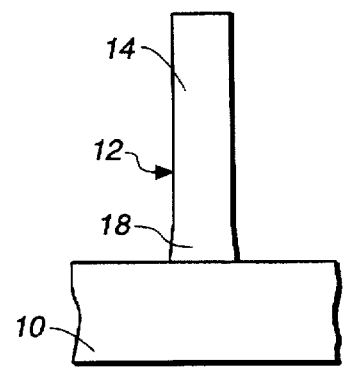
FIG._8

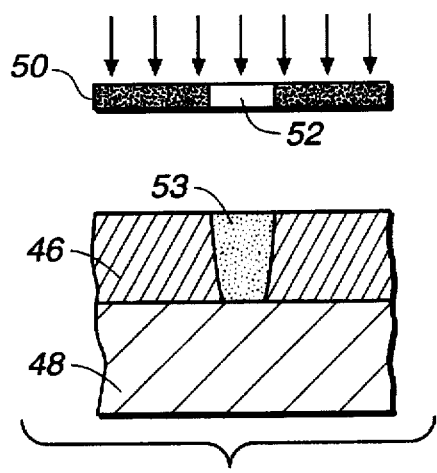
FIG._9
*(PRIOR ART)*
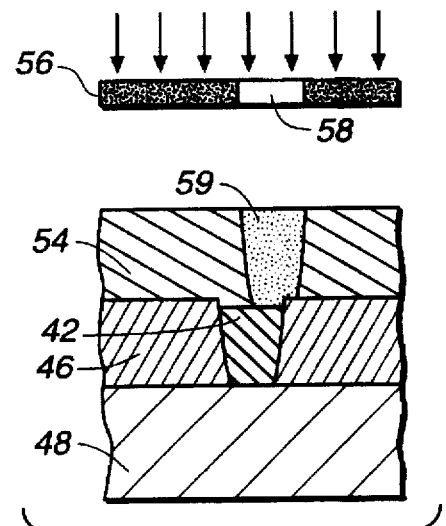
FIG._11
*(PRIOR ART)*
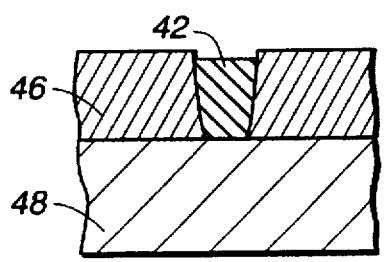
FIG._10
*(PRIOR ART)*
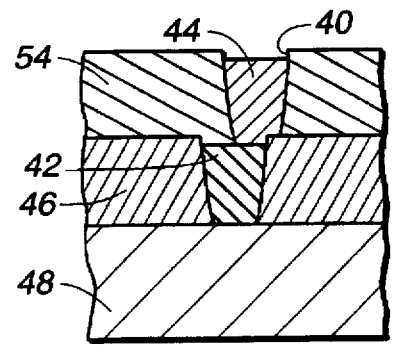
FIG._12
*(PRIOR ART)*

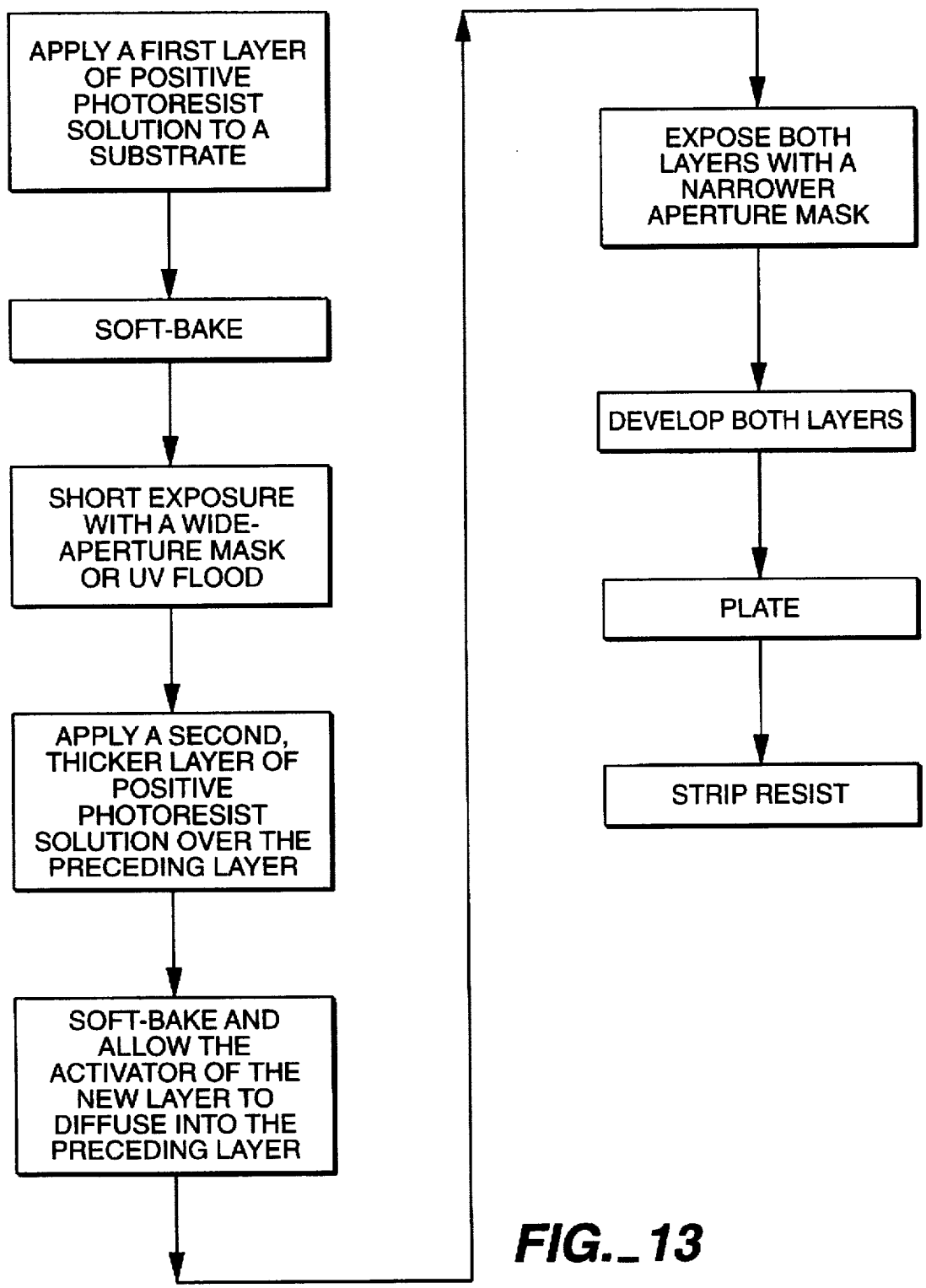
FIG._13

FABRICATION PROCEDURE FOR A STABLE POST

FIELD OF THE INVENTION

This invention relates to the field of integrated circuit (IC) chip packaging, and in particular to methods of forming interconnecting posts used to mount IC chips to first level packaging substrates; specifically the forming, with a single development step, of integral shear-resistant posts whose component parts are self-aligned during fabrication.

BACKGROUND OF THE INVENTION

In the fabrication of integrated circuit chip package modules, the circuitry of the IC chip or chips are connected to a first level IC chip package substrate at a large number of interconnect points. Modern high density IC chips may comprise the need for hundreds or more interconnection points so that a very high density of interconnect points is necessary, given the very small size of IC chips. Formation of the interconnects can be accomplished in a number of different ways, whose advantages and disadvantages are described in detail in co-assigned U.S. Pat. No. 5,334,804 to Love, et al., the disclosure of which is incorporated herein by reference. However, as disclosed in that patent, the preferred way to reliably interconnect a chip to a package substrate with a very high density of interconnects is to form high aspect ratio interconnect posts (i.e., posts whose height is typically equal to 4–8 times their diameter) between the substrate and the IC chip. The interconnect posts can be formed on either the substrate or the chip, and may be formed on top of a base pedestal layer. Typically, the diameter of a state-of-the-art high-aspect-ratio interconnect post is on the order of a dozen microns. Such posts can be formed by processes like those described in the aforementioned U.S. Pat. No. 5,334,804.

One reason for using post interconnect is that the circuitry of the IC chip can generate substantial amounts of heat during operation, thereby expanding the dimensions of the chip and generating shear stresses at the ends of the post where they join to the substrate and chip. The higher the aspect ratio of the post, the more easily the post can flex to follow the expansion of the IC chip, and the less shear stress is imposed on the post ends.

As disclosed in U.S. Pat. No. 5,334,804, the interconnect post may be constructed by first forming a spacer layer on top of the substrate (or IC chip), thereafter forming an aperture in the spacer layer that acts as a mold for the post, thereafter depositing or electroplating conductive material into the aperture to form the post, and thereafter removing the spacer layer. It is convenient to use a photoresist to form the spacer layer as photoresist technology is relatively mature and relatively inexpensive. However, it has been the inventors' experience that currently available photoresists are limited in their ability of defining apertures having aspect ratios above approximately 3:1 (height:diameter), with diameters around 12 µm. It is often observed that the bottom portion of such apertures are narrowed down to less than 6 µm, and often to 3 µm. Although posts formed in apertures with such constrictions are electrically operable, they have a higher probability of fracturing at their bottom ends in response to thermal cycling, and consequently have relatively short lifetimes.

One approach to addressing this problem is to form the high aspect-ratio post by first forming a shorter post in a first spacer layer of photoresist, then forming a second photoresist spacer layer on top of the first spacer layer, and thereafter forming a second short post on top of the first short post. Unfortunately, there is a chance that the top post will be misaligned to the first post, thereby creating a constriction point that is susceptible to fracture. Additionally, separate plating operations would be required, which would entail a risk of poor adhesion. Extra processing steps would be required to prevent such risk and ensure good adhesion. Accordingly, it would be preferable to be able to form the post in a single spacer layer to reduce manufacturing costs and prevent misalignments.

SUMMARY OF THE INVENTION

Broadly stated, the present invention addresses the difficulties of forming high-aspect ratio apertures in photoresist spacer layers by forming a first photoresist layer over a substrate, briefly exposing to actinic radiation at least a portion of the first layer where the aperture is to be built, and thereafter forming a second photoresist layer on top of the first. The term "substrate" as used herein includes the sum total of all layers which have been built up on the substrate prior to applying the first photoresist layer according to the present invention. The first and second layers are then exposed to a conventional pattern exposure step to define the aperture, and thereafter developed to form the aperture. It is observed that the first, brief exposure of the first layer to actinic radiation substantially mitigates the constriction at the bottom of the aperture.

In accordance with a preferred embodiment of the invention, a first layer of a solution of a positive photoresist in an organic solvent is first applied to the substrate. Positive photoresists are resins mixed with an activator consisting of diazo compounds. This mixture is normally soluble in the organic solvent but insoluble in an alkaline-aqueous solution.

Following a soft bake at about 90° C.–100° C. to remove the organic solvent used to fluidize the photoresist, the first layer is exposed for a relatively short time to ultraviolet (UV) light to partially decompose and deactivate the diazo molecules and make the exposed photoresist somewhat soluble in the alkaline-aqueous solution, but the exposed photoresist is not developed at this time. The exposure of the first layer may be through a mask which allows UV light penetration in an area at least as large as the maximum diameter of the post, or it may preferably be a UV flood exposure (i.e., without a mask). The exposure time is typically less than one-third of the photoresist manufacturer's recommended exposure time for the layer's thickness and soft bake conditions (e.g., time and temperature).

A second layer of positive photoresist, preferably of substantially the same composition as the first, is next applied over the first layer and soft-baked to remove the solvent. The total thickness of the first and second layers is equal to the desired post height, which may for example be 35 µm–50 µm. Although the processes occurring within the layers are not fully understood, empirical results suggest that the application of the second layer and its soft baking causes what is believed to be some diffusion of the second layer's undecomposed activator into the first layer, thereby changing the exposed first layer's solubility in the alkaline-aqueous solution into a solubility gradient ranging from a low value adjacent the second layer to a higher value adjacent the substrate. The phenomenon appears to be enhanced by a partial intermixing of the first and second layers caused by a diffusion of the second layer's organic solvent into the first layer. This aids in the diffusion of the undecomposed photoactive compound.

The second and first layers are now both exposed to ultraviolet light through an appropriate mask in an area corresponding to the diameter of the post's column. The exposure time is substantially equal to or greater than the manufacturer's recommended exposure time for the combined layer thickness and the soft bake conditions. The exposure causes the second layer to become soluble in the alkaline-aqueous solution in the area of the post column. In the first layer, this second exposure makes the area reached by the UV radiation completely soluble. In addition, an increasing area of the first layer becomes soluble in a downward direction from its junction with the second layer because of the decreasing concentration in that direction of the diffused undecomposed activator.

The first and second photoresist layers are then developed in the alkaline-aqueous solution. The water dissolves the exposed photoresist, and the alkaline component of the solution promotes cross-linking of the resin molecules in the unexposed areas of the resist, which increases the insolubility of the unexposed areas. An opening, or aperture, is formed in the photoresist which has the shape of a post of generally uniform diameter. The diameter at the bottom of the opening is significantly larger than that achieved by using a single photoresist layer having the same total thickness of the first and second photoresist layers. A plating operation will now result in the formation, in that opening, of an integral, generally cylindrical high aspect ratio metallic post resting on the substrate. The photoresist can now be stripped, and the metallic post remains.

It is thus an object of the invention to provide a simple method for fabricating high-aspect-ratio apertures in photoresist materials and the like, with the cross-sections of the apertures remaining substantially constant throughout their heights.

It is a further object of the present invention to enable, by use of such apertures, the construction of microelectronic interconnect posts whose cross-section remains substantially constant throughout their heights.

It is yet another object of the invention to produce stronger, more reliable microelectronic interconnect posts at lower cost.

These and other objects of the present invention will become apparent to those of ordinary skill in the art from the present specification and accompanying figures.

BRIEF DESCRIPTION OF THE DRAWINGS

FIG. 1 is a perspective view showing a chip substrate with a set of interconnect posts formed in accordance with this invention;

FIGS. 2-8 are vertical sections of the substrate of FIG. 1 at successive times in the formation of the post of FIG. 1;

FIGS. 9-12 are vertical sections illustrating a prior art post fabrication process; and FIG. 13 is a flow diagram illustrating the steps of the inventive process.

DESCRIPTION OF THE PREFERRED EMBODIMENTS

FIG. 1 shows, as a matter of example, a multichip module substrate 10 on which a plurality of interconnect posts 12 are formed in accordance with a preferred embodiment of the invention. The tops of the columns 14 of the posts 12 are adapted to be electrically and mechanically joined at suitable connection points 17 on an IC chip 16 by an appropriate conventional method such as soldering. A number of methods are available for joining interconnect posts to an IC chip, and the choice of method is not material to this invention. The bases 18 of the posts 12 may be connected to appropriate electrical circuitry by leads 20. The leads 20 may have been previously formed on the substrate 10, and they are, for the purposes of this invention, considered to be part of the substrate 10. Alternatively, leads 20 can be embedded within a layer of the substrate and connected to the posts using vias, as is well known in the art.

FIGS. 2 through 8 illustrate the process of forming the posts 12 on the substrate 10. The process begins (FIG. 2) by applying onto the surface of substrate 10 a first photoresist layer 22 of conventional positive photoresist dissolved in an organic solvent. The photoresist solution may be applied by any method well known to those skilled in the art, such as a conventional spin technique. The thickness of the layer 22 is such that when the solvent is evaporated by soft baking at about 90° C.–100° C., the layer 22 will have a thickness less than or equal to half the desired height of the posts 12, and preferably equal to between approximately 15% and 40% of the desired post height. Typical thicknesses for layer 22 range between 5 μm and 15 μm.

As shown in FIG. 3, the soft-baked layer 22 is next exposed to actinic UV radiation 21 of an appropriate wavelength (e.g. on the order of 400 nm) for a relatively short time. For typical positive photoresists, this exposure time is less than one-third of the photoresist manufacturer's recommended (or suggested) exposure time for the resist layer's thickness and soft bake conditions (e.g., time and temperature). The exposure may be done through a mask 24 whose apertures 26 are of a substantially larger diameter than the diameter of post 12. Alternatively, the exposure may be a simple UV flood exposure of the entire first layer 22. The brief exposure of UV radiation 21 causes the activator in the positive photoresist to partially decompose, so that the exposed portions of the layer 22 (or, in the alternative, the entire layer 22) become somewhat soluble in the alkaline-aqueous developer solution. The exposure should be short enough to prevent interfering with the subsequent mixing of the layers' photoresist when the second photoresist layer is applied, or interfering with the ability of the second layer to adhere to the first layer. In the drawings, the partially solubilized portions of layer 22 are shown as dotted, while the still insoluble portions are shown as cross-hatched. In one practiced embodiment according to the present invention, the positive photoresist AZ4620, manufactured by Hoechst Celanese is used for first layer 22. The AZ4620 resist layer is exposed for less than about 20 seconds at an exposure level of 40 mW/cm2 (for an integrated dosage of less than about 800 mW/cm2-sec), and preferably less than 5 seconds at the same exposure level (for an integrated dosage of less than about 200 mW/cm2-sec).

Next, as shown in FIG. 4, a relatively thick (e.g., 35 μm–50 μm) layer 28 of positive photoresist is applied on top of the layer 22. Preferably, layers 22 and 28 have common chemical components, such as the photo activator compound, although proportions of various components (such as the fluidizing solvent) may be modified to better achieve the desired coating thicknesses. The thickness of layer 28 is such that, after evaporation of the solvent by soft-baking, the total thickness of layers 22 and 28 will equal the desired post height. In the above practiced embodiment according to the present invention, second layer 28 also comprises the AZ4620 photoresist.

When the exposed portion 29 of layer 22 comes into contact with the unexposed material of layer 28, the photoactive compound and solvent of layer 28 begin to diffuse into the soluble area 29 of layer 22. The diffusion rate is enhanced as the temperature of the layers is increased by the soft baking of layer 28. If necessary or desirable to control the diffusion of these compounds, the layers may be heated independently of the soft bake process. The result of this diffusion is that the solubility of layer 22 is modified in such a way that the solubility of layer 22 in area 29 gradually changes from essential insolubility at the junction with layer 28 to partial solubility at the junction with the substrate 10.

The soft-baked layer 28 and the diffused area of layer 22 are now exposed to UV radiation 21 (FIG. 5) through a mask 30 whose apertures 32 are of substantially the same diameter as the diameter of columns 14. The exposure time is substantially equal to or greater than the manufacturer's recommended (or suggested) exposure time for the combined layer thickness and the soft bake conditions. This exposure results in the complete solubilizing of a downwardly tapered cylinder 34 of photoresist extending through the entire height of both layer 28 and layer 22. For the above practiced embodiment using the AZ4620 photoresist and a combined layer thickness of 45 μm, an exposure time of 3 to 4 minutes is used, with 4 minutes being an overexposure.

When the layers 22 and 28 are exposed to an alkaline-aqueous developing solution, the water-soluble material of the cylinder 34 is dissolved and removed. However, because the area 29 of layer 22 is partly soluble even outside of the cylinder 34, and increasingly so in the downward direction toward substrate 10, the developing solution eats horizontally into the layer 22 by a small amount adjacent the layer 28, and increasingly toward the substrate 10. The result of this developing step is the formation of an opening 36 in the resist layers 28 and 22 which has the shape of a cylinder with a generally uniform cross-section (FIG. 6).

The opening 36 can now be filled with metal by electrolytic or electroless plating (FIG. 7). The plating step is usually terminated when the level of the filled metal reaches to within 1 μm of the aperture top in order to prevent lateral ballooning at the top. When the plating has been completed, a metallic post 12 of the shape shown in FIG. 1 has been formed on the substrate 10. In contrast to the aforementioned construction method where post segments are constructed on top of one another with separate spacer layers and separate plating steps, posts utilizing the aperture construction method according to the present invention can be formed by a single plating step, and thus may be of integral construction. Such construction is less likely to fail when subjected to stress.

After the post according to the present invention is formed in the foregoing manner, the resist is stripped (FIG. 8), and the structure of FIG. 1 is ready for connection to another microelectronic component, such as an IC chip. Although plating is the preferred method of depositing metal within openings 36, those skilled in the art will appreciate that other methods can also be used. As well as constructing post structures, the method of the present invention may be used to construct other structures, such as trenches, pads, lines, and particularly those structures that have large thicknesses and/or features with large aspect ratios.

FIGS. 9 through 12 show the aforementioned construction method where post segments are constructed on top of one another with separate plating steps, and illustrate the advantages of the invention. In the multi-segment construction method, a two-segment post 40 (FIG. 12) having first segment 42 and second segment 44 was formed by applying a first photoresist layer 46 to a substrate 48, and exposing it through a mask 50 whose aperture 52 defined a solubilized portion 53 having the size and shape of the first segment 42 (FIG. 9). The layer 46 was then developed, and the resulting opening was filled with metal by plating (FIG. 10). Next, a second photoresist layer 54 was applied and exposed through a mask 56 whose aperture 58 defined a solubilized portion 59 having the size and shape of the second segment 44 (FIG. 11). The layer 54 was in turn developed and plated (FIG. 12).

Any misregistration of the masks 50 and 56 causes a misalignment of the second segment 44 on the first segment 42. Such a misalignment is illustrated in FIGS. 11 and 12. Considering that the diameter of column 44 is typically on the order of about a dozen microns or less, a misregistration of one or two microns can cause significant problems. By contrast, the present invention makes misalignment impossible because the first exposure is too brief to fully solubilize the first photoresist layer, and because the second exposure more fully exposes a portion of the first layer which is self-aligned to the exposed portion of the second layer.

FIG. 13 illustrates the essential steps of the process of this invention in flow chart form. It will be understood that the process of this invention not only solves the alignment problem, but is much simpler because only a single developing and plating step is involved. It will also be understood that the inventive process is applicable to the formation of any high-aspect-ratio microelectronic structure in which it is necessary to maintain a generally uniform cross-sectional area throughout the height of the structure.

While the present invention has been particularly described with respect to the illustrated embodiment, it will be appreciated that various alterations, modifications and adaptations may be made based on the present disclosure, and are intended to be within the scope of the present invention. For example, the invention may be practiced with other photosensitive materials besides positive photoresists, such as photosensitive polyimides. Additionally, the invention may be used to form low-aspect ratio patterns in thick resists where the precise definitions of the pattern boundaries is required. While the invention has been described in connection with what is presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. A method of forming an aperture, which may be used to fabricate a post on a substrate, said method comprising the steps of:

a) forming on said substrate a first layer of positive photoresist;

b) after step (a) has been performed, exposing a first portion of said first layer to an amount of actinic radiation which is insufficient to render the exposed first portion fully soluble in a developing solution;

c) after step (b) has been performed, applying a second layer of positive photoresist over said first layer, said second layer having a second portion which overlies said first portion of said first layer;

d) after step (c) has been performed, pattern exposing said second portion to an amount of actinic radiation which is sufficient to render said second portion soluble in a developing solution, said pattern exposing step further exposing a part of said first portion which is beneath said second portion to render it soluble in said developing solution; and e) after step (d) have been performed, developing said first and second layers to remove photoresist material from said first and second portions and to thereby form an aperture in said first and second layers.

2. The method of claim 1 further comprising the steps of filling said aperture with electrically conductive material to form a post in said aperture.

3. The method of claim 2 wherein said filling step comprises the steps of plating material.

4. The method of claim 2, further comprising the step of removing said photoresist layers after said filling step.

5. The method of claim 1, in which said second layer is substantially thicker than said first layer.

6. The method of claim 5, in which said first layer has a thickness of between about 5 µm and about 15 µm, and said second layer has a thickness of between about 35 µm and about 50 µm.

7. The method of claim 5, in which said first layer is exposed substantially for less than five seconds at substantially 40 mW/cm2 with ultraviolet radiation.

8. The method of claim 1, in which said first layer is exposed for a period sufficiently short to prevent interfering with the mixing of photoactive compounds from said first and second layers when said second layer is applied over exposed areas of said first layer.

9. The method of claim 8, in which said first layer is exposed substantially for a period of less than 20 seconds at an ultraviolet light intensity of substantially 40 mW/cm2.

10. The method of claim 1, in which said step (b) of exposing said first layer comprises the step of blank flood exposure.

11. The method of claim 1 wherein the aperture area of said first portion is larger than the aperture area of said second portion.

12. The method of claim 1, in which the step (b) exposes said first layer to an integrated dosage of actinic radiation of not more than 800 mW/cm2-seconds.

13. A method of forming a structure of substantially uniform cross-sectional area on a substrate, comprising sequentially the steps of:

a) forming a first layer of a material not normally soluble in a developing solution but becoming soluble therein upon exposure to actinic radiation, said material including an insolubilizing compound capable of diffusing into solubilized portions of said material to modify their solubility;

b) exposing, a first selected area of said first layer to a first dosage of said actinic radiation;

c) forming a second layer of said material over said first layer;

d) diffusing said insolubilizing compound of said second layer into a portion of said selected area of said first layer;

e) exposing a second selected area of said first and second layers to a second dosage of said actinic radiation which is greater than said first dosage, said second selected area being within said first selected area;

f) developing said material with said developing solution to form aligned openings in said first and second layers; and g) filling said openings simultaneously with a second material to form said structure.

14. The method of claim 13, in which said filling step includes plating said material with metal.

15. The method of claim 13, in which said first selected area is substantially larger than said second selected area.

16. The method of claim 13, wherein the step (d) of diffusing comprises the step of heating the first and second layers.

* * * * *